United States Patent [19]
Suzuki

[11] Patent Number: 6,026,043
[45] Date of Patent: Feb. 15, 2000

[54] SEMICONDUCTOR MEMORY DEVICE WITH REDUCED POWER CONSUMPTION AND STABLE OPERATION IN DATA HOLDING STATE

[75] Inventor: Tomio Suzuki, Hyogo, Japan

[73] Assignee: Mitsubishi Denki Kabushiki Kaisha, Tokyo, Japan

[21] Appl. No.: 09/039,411

[22] Filed: Mar. 16, 1998

[30] Foreign Application Priority Data

Sep. 16, 1997 [JP] Japan ..................... 9-250409

[51] Int. Cl.⁷ ............................... G11C 11/24
[52] U.S. Cl. ............... 365/222; 365/185.25; 365/189.11
[58] Field of Search ..................... 365/149, 222, 365/203, 185.22, 189.11

[56] References Cited

U.S. PATENT DOCUMENTS

| | | | |
|---|---|---|---|
| 5,694,365 | 12/1997 | Nakai ....................... | 365/203 |
| 5,699,303 | 12/1997 | Hamamoto et al. . | |
| 5,712,825 | 1/1998 | Hadderman ............... | 365/222 |
| 5,822,264 | 10/1998 | Tomishima ............... | 365/222 |
| 5,841,705 | 11/1998 | Hamamoto et al. . | |
| 5,867,438 | 2/1999 | Nomura et al. ........... | 365/222 |
| 5,877,978 | 3/1999 | Morishita et al. ........ | 365/149 |

FOREIGN PATENT DOCUMENTS

| | | |
|---|---|---|
| 0 196 586 B1 | 3/1986 | European Pat. Off. . |
| 0 469 587 A2 | 7/1991 | European Pat. Off. . |
| 36 87 533 T2 691 230 302 | 3/1986 | Germany . |
| T2 196 13 667 | 7/1991 | Germany . |
| A1 | 4/1996 | Germany . |

*Primary Examiner*—Viet Q. Nguyen
*Attorney, Agent, or Firm*—McDermott, Will & Emery

[57] ABSTRACT

The semiconductor memory device has a normal operation mode and a self-refresh mode, and includes a $V_{BB}$ generation circuit generating a first substrate voltage when an internal power supply voltage is larger than a predetermined value and a second substrate voltage of an absolute value smaller than that of the first substrate voltage when $V_{CC}$ is smaller than the predetermined value, a bit line equivalent voltage generation circuit outputting voltage $V_{CC}/2$ produced by resistive dividing when internal power supply voltage is lower than the predetermined value in self-refresh mode, a 4KE signal generation circuit generating a signal for performing a 4K operation in the self-refresh mode when internal power supply voltage is lower than the predetermined value and a refresh address generation circuit.

10 Claims, 18 Drawing Sheets

FIG. 15A
Vcc
FIG. 15B
/BBU
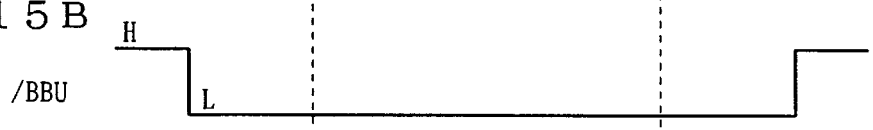
FIG. 15C
n11
FIG. 15D
/BBUL
FIG. 19
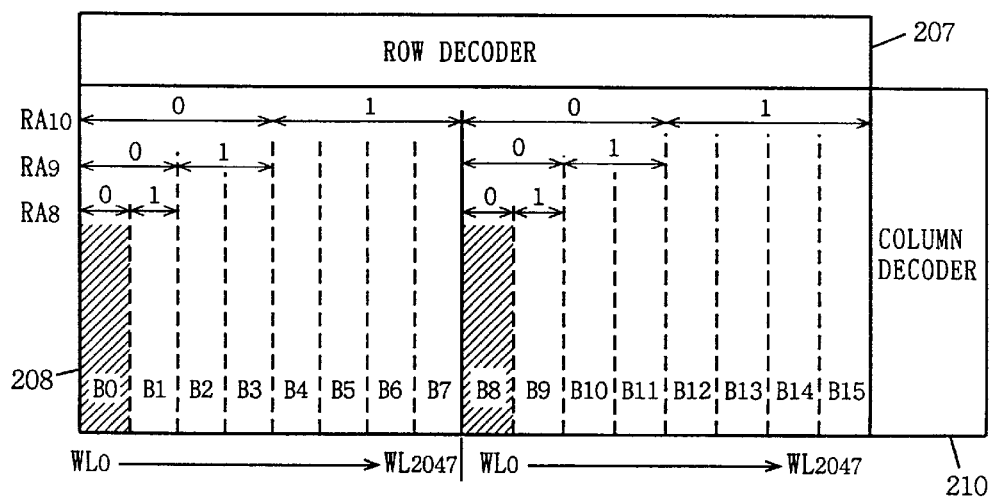

WLn

BLn,/BLn

Icc

Vcc

WLn

BLn,/BLn

Icc

Vcc

Vcc

/BBU n11

4KE

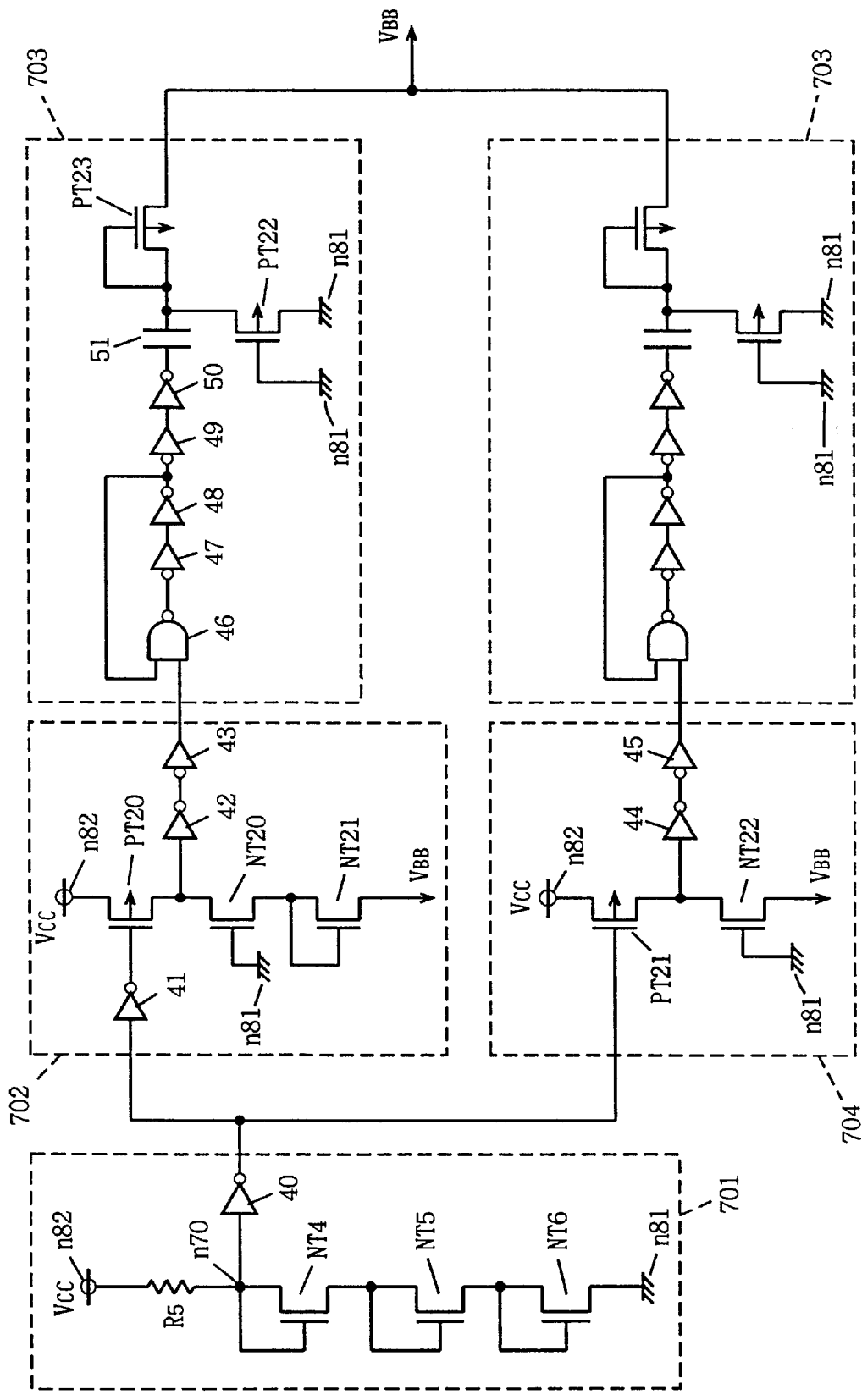
F I G. 2 5

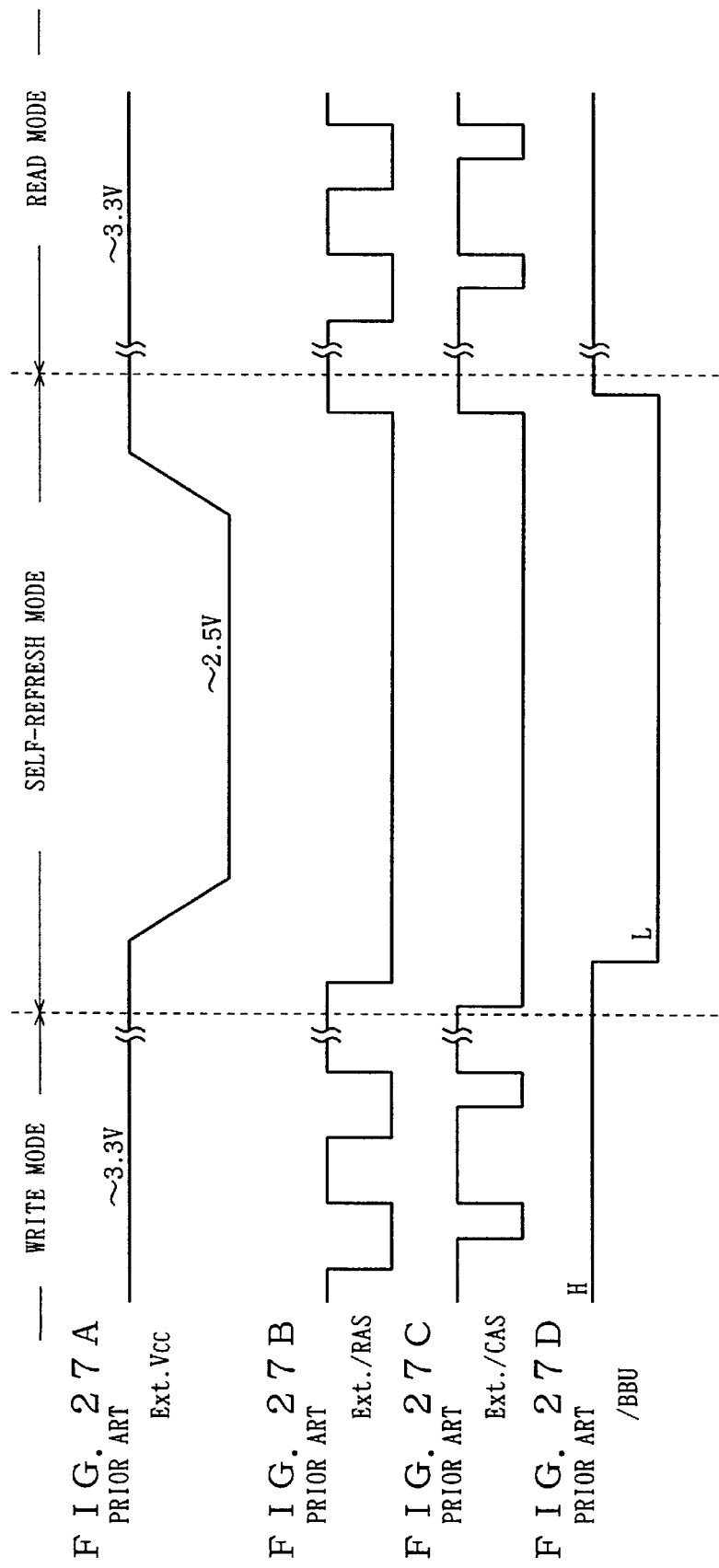

SEMICONDUCTOR MEMORY DEVICE WITH REDUCED POWER CONSUMPTION AND STABLE OPERATION IN DATA HOLDING STATE

BACKGROUND OF THE INVENTION

1. Field of the Invention

The present invention relates generally to a semiconductor memory device, and more particularly, to a semiconductor memory device having a normal operation mode and a self-refresh mode.

2. Description of the Background Art

In recent years, portable computers have continued to be developed. A semiconductor memory device used in such a portable computer is required to have the capabilities of holding data such as file data which used to be performed by a conventional hard disk, and of operating with low power consumption in the data holding state.

In a semiconductor memory device, a self-refresh state generally corresponds to the data holding state.

Meanwhile, a technique to lower an external power supply voltage Ext.$V_{CC}$ in the data holding state (self-refresh mode), as shown in FIG. 27A, from about 3.3 V in a write mode and a read mode to about 2.5 V, for example, has been developed in order to reduce power consumption by portable computers. Herein, as shown in FIGS. 27B and 27C, switching from the write mode to the self-refresh mode is achieved by the generation of CBR (CAS Before RAS) timing in which an external column address strobe signal Ext./CAS is activated prior to an activation of an external row address strobe signal Ext./RAS. A self-refresh entry control signal /BBU is activated to a low (L:logical low) level as shown in FIG. 27D.

Reduction in an internal power supply voltage $V_{CC}$ in the data-holding state for power saving, however, causes the increase in a current Icc consumed in a substrate voltage generation circuit when voltage $V_{CC}$ is equal to or less than a voltage $V_{c1}$ as shown by the solid line in FIG. 10. As a result, power consumption increases in the substrate voltage generation circuit, for example.

In addition, stable reading/writing operation from/to a memory cell is made difficult by lowering internal power-supply voltage $V_{CC}$.

SUMMARY OF THE INVENTION

An object of the invention is, therefore, to provide a semiconductor memory device capable of stable operation with reduced power consumption in the data holding state (the self refresh-mode).

In accordance with one aspect of the invention, a semiconductor memory device includes a substrate, a memory cell array formed on the substrate and having a plurality of memory cells storing data, a memory cell selection circuit, formed on the substrate for selecting at least one of the plurality of memory cells from/to which data is read out/ written, and, a substrate voltage generation circuit formed on the substrate for generating and supplying to the substrate a first substrate voltage when an internal power supply voltage is larger than a predetermined value and a second substrate voltage with an absolute value smaller than the absolute value of the first substrate voltage when the internal power supply voltage is smaller than the predetermined value.

In accordance with another aspect of the invention, a semiconductor memory device, having a normal operation mode and a self-refresh mode, includes a plurality of word lines, a plurality of bit line pairs orthogonal to the plurality of word lines, a plurality of memory cells arranged corresponding to crossings of the plurality of word lines and the plurality of bit line pairs, a bit line precharge circuit for supplying a bit line equivalent voltage to each one of the plurality of bit line pairs, a bit line equivalent voltage generation circuit for generating a bit line equivalent voltage, and a mode switching circuit for switching the mode between the normal operation mode and the self-refresh mode according to external control signals, and the bit line equivalent voltage generation circuit includes a resistive divider for dividing the internal power-supply voltage in two by resistance to generate the bit line equivalent voltage in the self-refresh mode.

In accordance with still another aspect of the invention, a semiconductor memory device, having a normal operation mode and a self-refresh mode, includes a plurality of word lines, a plurality of bit lines orthogonal to the plurality of word lines, a plurality of memory cells arranged corresponding to crossings of the plurality of word lines and the plurality of bit lines, a mode switching circuit for switching the mode between the normal operation mode and the self-refresh mode according to external control signals, and a word line selection circuit for simultaneously selecting less word lines of the plurality of word lines than are simultaneously selected in the normal operation mode, when the mode switching circuit switches the mode to the self-refresh mode.

Accordingly, an advantage of the invention lies in that the power consumption is surely reduced in the data holding state.

A further advantage of the invention is that increased stability can be obtained together with the reduction in power consumption in the self-refresh operation.

A still further advantage of the invention is that further reduction in power consumption can be obtained in the self-refresh mode.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 15A–15D are timing charts used in describing the operation of the /BBUL signal generation circuit shown in FIG. 11.

FIG. 19 is a diagram used in describing a 2K operation.

FIG. 25 is a circuit diagram showing a configuration of the $V_{BB}$ generation circuit provided in a semiconductor memory device according to a second embodiment of the invention.

FIGS. 27A–27D are timing charts used in describing the operation of a conventional semiconductor memory device.

DESCRIPTION OF THE PREFERRED EMBODIMENTS

Figure 1:
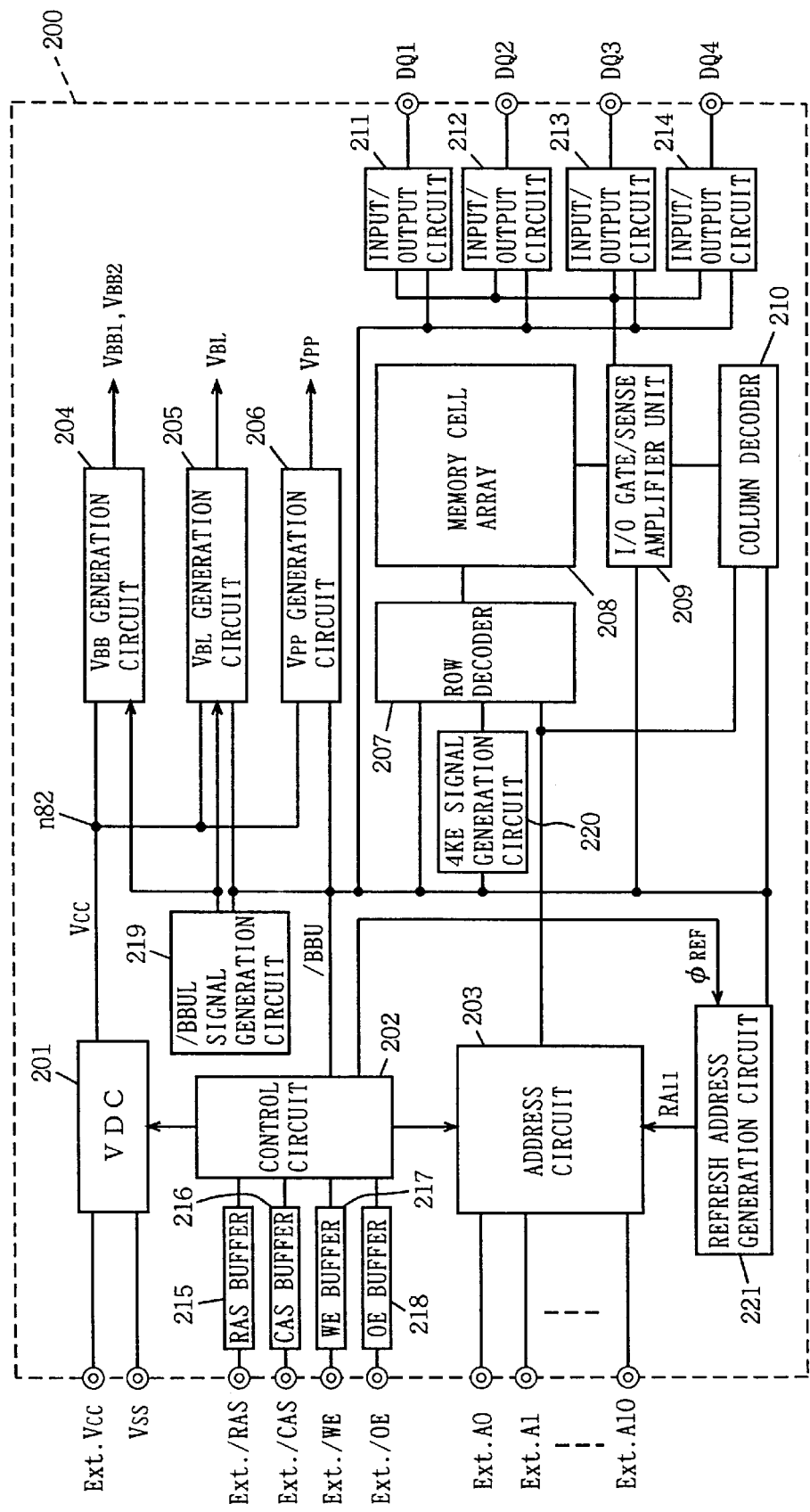
FIG. 1 is a block diagram showing the entire configuration of a semiconductor memory device according to a first embodiment of the invention.

Hereinafter, the preferred embodiments of the invention will be described in detail in accordance with the drawings. The same reference character represents the same or a corresponding element.

First Embodiment

FIG. 1 is a block diagram showing the entire configuration of a semiconductor memory device according to the first embodiment.

Referring to FIG. 1, the semiconductor memory device, having a normal operation mode and a self-refresh mode, includes a substrate 200, a memory cell array 208 formed on substrate 200 and having a plurality of memory cells storing data, a row decoder 207 for selecting a word line connected to a memory cell to/from which data is written /read out of the plurality of memory cells, a 4KE signal generation circuit 220 connected to a control circuit 202 for generating a signal 4KE to supply to row decoder 207, a column decoder 210 for selecting a bit line connected to the above memory cell to/from which data is written/read out, an I/O gate/sense amplifier unit 209 inputting/outputting data to/from memory cell array 208 and amplifying read data, an address circuit 203 supplying an internal row address and an internal column address to row decoder 207 and column decoder 210, respectively, an RAS buffer 215 buffering an external row address strobe signal Ext./RAS to generate a row address strobe signal /RAS, a CAS buffer 216 buffering an external column address strobe signal Ext./CAS to generate a column address strobe signal /CAS, a WE buffer 217 buffering an external write enable signal Ext./WE to generate a write enable signal /WE, an OE buffer 218 buffering an external output enable signal Ext./OE to generate an output enable signal /OE, a control circuit 202 receiving row address strobe signal /RAS, column address strobe signal /CAS, write enable signal /WE, and output enable signal /OE to control various internal circuits as well as to switch the mode between the normal operation mode and the self-refresh mode, a refresh address generation circuit 221 connected to control circuit 202 for generating and supplying a refresh address $RA_{11}$ to address circuit 203 in the self-refresh mode, a voltage down converter (VDC) 201 connected to control circuit 202 and receiving external power supply voltage Ext.$V_{CC}$ and a voltage $V_{SS}$ to output a pulled down internal power-supply voltage $V_{CC}$, a substrate voltage ($V_{BB}$) generation circuit 204 connected to VDC 201 and a /BBUL signal generation circuit 219 for generating and supplying to substrate 200 a substrate voltage $V_{BB1}$ in the normal operation mode and a substrate voltage $V_{BB2}$ of an absolute value smaller than the absolute value of substrate voltage $V_{BB1}$ in the self-refresh mode, a bit line equivalent voltage ($V_{BL}$) generation circuit 205 connected to VDC 201 and control circuit 202 for generating bit line equivalent voltage $V_{BL}$ supplied to each bit line pair BLn, /BLn included in memory cell array 208, /BBUL signal generation circuit 219 connected to control circuit 202 for generating and supplying a signal /BBUL to $V_{BB}$ generation circuit 204 and $V_{BL}$ generation circuit 205, a boosted voltage ($V_{PP}$) generation circuit 206 connected to DC 201 and control circuit 202 for boosting internal power supply voltage $V_{CC}$ to generate a boosted voltage $V_{PP}$, and input/output circuits 211–214 controlled by control circuit 202 for inputting/outputting data DQ1–DQ4 to/from I/O gate/sense amplifier unit 209. In addition, the semiconductor memory device may include a cell plate voltage generation circuit (not shown) having the same configuration as $V_{BL}$ generation circuit 205.

Figure 2:
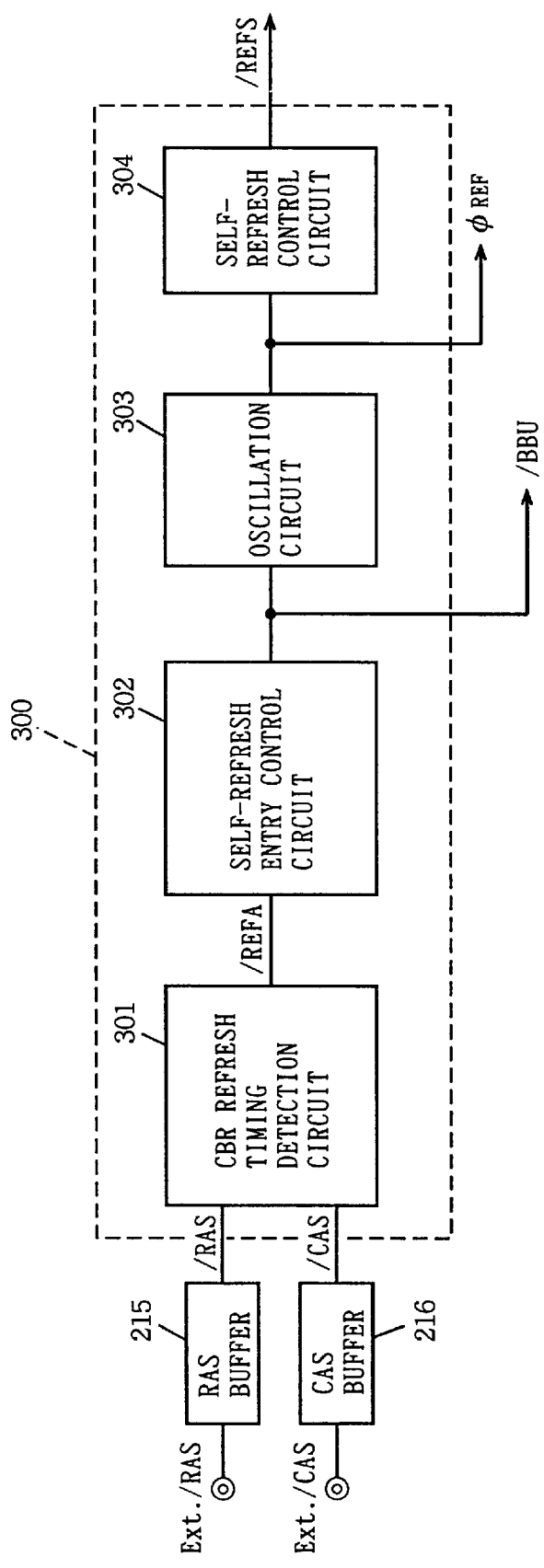
FIG. 2 is a block diagram showing the configuration of circuits included in a control circuit shown in FIG. 1.

FIG. 2 is a block diagram showing the configuration of a circuit 300, included in control circuit 202 shown in FIG. 1. Circuit 300 generates a self-refresh control signal /REFS, a self-refresh entry control signal /BBU and a reference signal $\phi_{REF}$.

As shown in FIG. 2, circuit 300 includes a CBR refresh timing detection circuit 301 connected to RAS buffer 215 and CAS buffer 216, a self-refresh entry control circuit 302 connected to CBR refresh timing detection circuit 301, an oscillation circuit 303 connected to self-refresh entry control circuit 302, and a self-refresh control circuit 304 connected to oscillation circuit 303.

Next, the operation of circuit 300 will be described referring to the timing charts of FIGS. 3A–3H.

Figure 3:
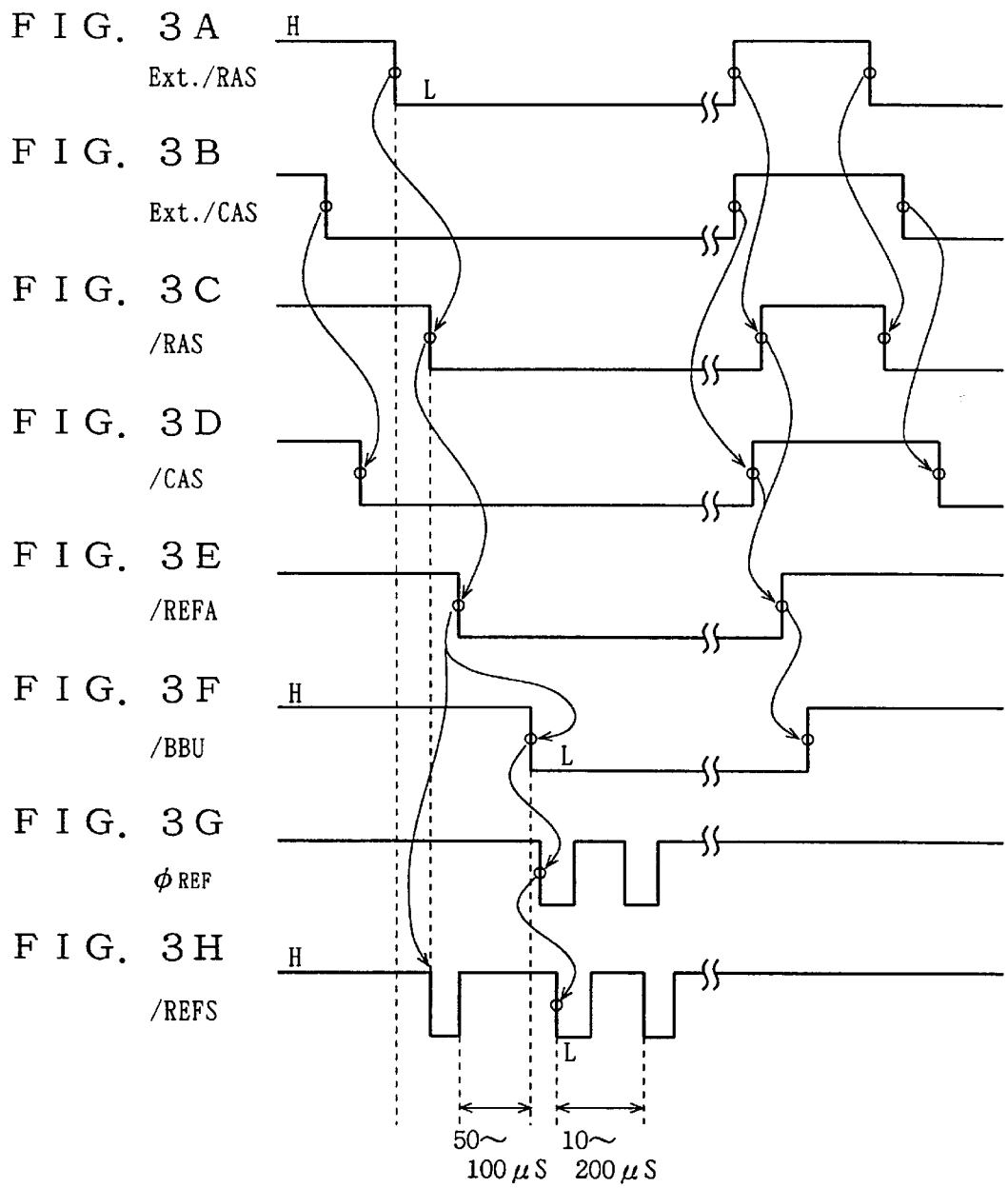
FIGS. 3A–3H are timing charts showing the operation of the circuits shown in FIG. 2.

External row address strobe signal Ext./RAS shown in FIG. 3A is buffered in RAS buffer 215, to generate a delayed row address strobe signal /RAS shown in FIG. 3C. External column address strobe signal Ext./CAS shown in FIG. 3B is buffered in CAS buffer 216, to generate a delayed column address strobe signal /CAS shown in FIG. 3D.

When column address strobe signal /CAS is activated before the activation of row address strobe signal /RAS, CBR refresh timing detection circuit 301 detects CBR refresh timing to output an activated CBR refresh control signal /REFA, as shown in FIGS. 3C–3E. Self-refresh entry control circuit 302 receives activated CBR refresh control signal /REFA from CBR refresh timing detection circuit 301, to generate an activated self-refresh entry control signal /BBU as shown in FIG. 3F. Oscillation circuit 303 receives self-refresh entry control signal /BBU from self-refresh entry control circuit 302 to generate reference signal $\phi_{REF}$ for the self-refresh operation, as shown in FIG. 3G. Self-refresh control circuit 304 outputs self-refresh control signal /REFS in response to reference signal $\phi_{REF}$, as shown in FIG. 3H. A time period from 50 $\mu$s–100 $\mu$s passes from the activation of self-refresh control signal /REFS following the activation of external row address strobe signal Ext./RAS to a low (L) level to the activation of self-refresh entry control signal /BBU to an L level, as shown in FIGS. 3A, 3F, and 3H. One cycle of self-refresh control signal /REFS is in the range of 10 $\mu$s to 200 $\mu$s.

Figure 4:
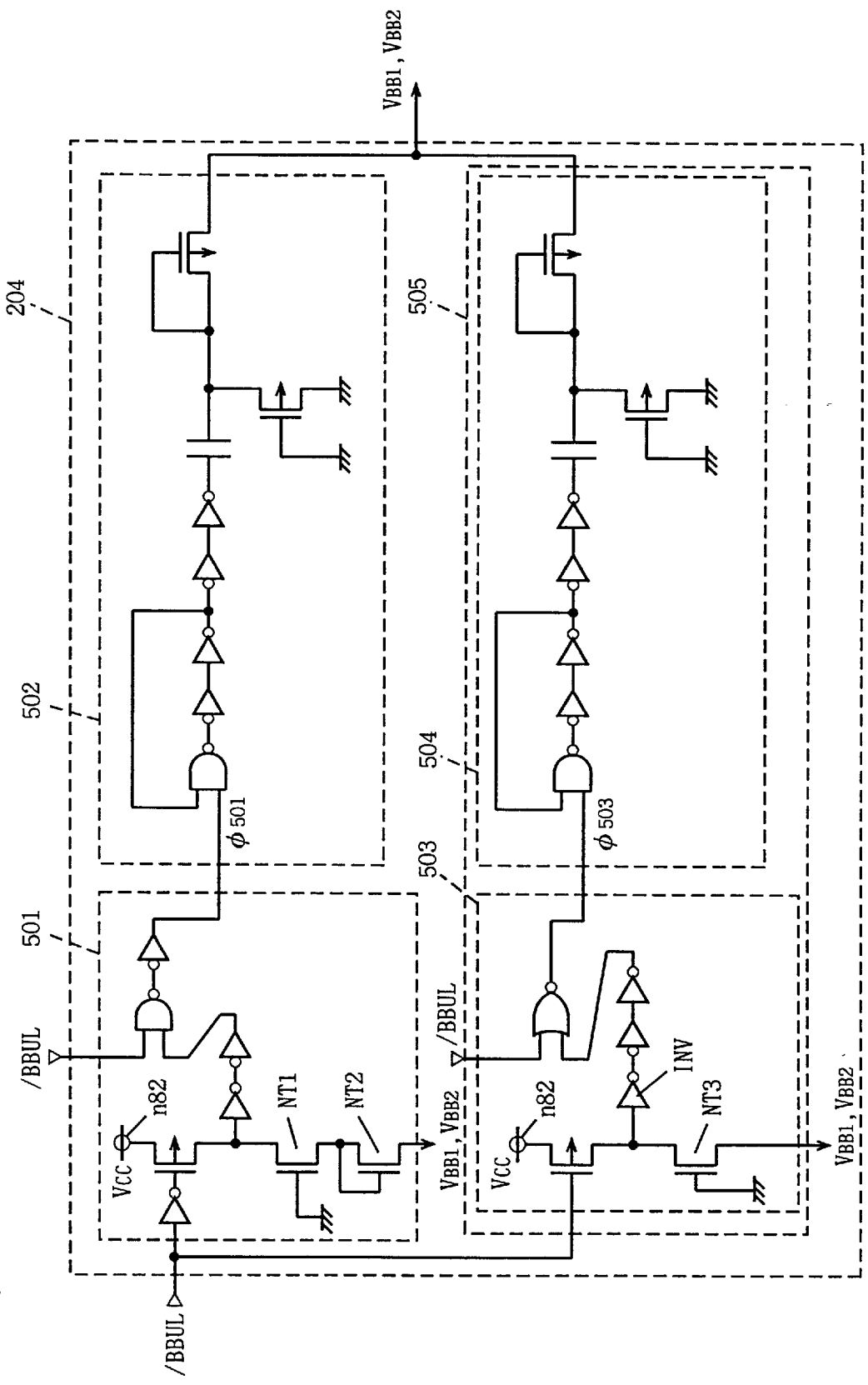
FIG. 4 is a circuit diagram showing the configuration of a $V_{BB}$ generation circuit shown in FIG. 1.

FIG. 4 is a circuit diagram showing the configuration of $V_{BB}$ generation circuit 204 of FIG. 1. As shown in FIG. 4, $V_{BB}$ generation circuit 204 includes a $V_{BB}$ level detection circuit 501 receiving signal /BBUL generated in /BBUL signal generation circuit 219 to output a $V_{BB}$ level detection signal $\phi_{501}$, a $V_{BB1}$ pumping circuit 502 receiving $V_{BB}$ level detection signal $\phi_{501}$ to output a substrate voltage $V_{BB1}$, a $V_{BB}$ level detection circuit 503 receiving signal /BBUL to output a $V_{BB}$ level detection signal $\phi_{503}$, and $V_{BB2}$ pumping circuit 504 receiving $V_{BB}$ level detection signal $\phi_{503}$ to output a substrate voltage $V_{BB2}$ of an absolute value smaller than the substrate voltage $V_{BB1}$.

Desirably, an inverter INV included in $V_{BB}$ level detection circuit 503 is a clocked CMOS circuit, in order to prevent a generation of through current.

Figure 5:
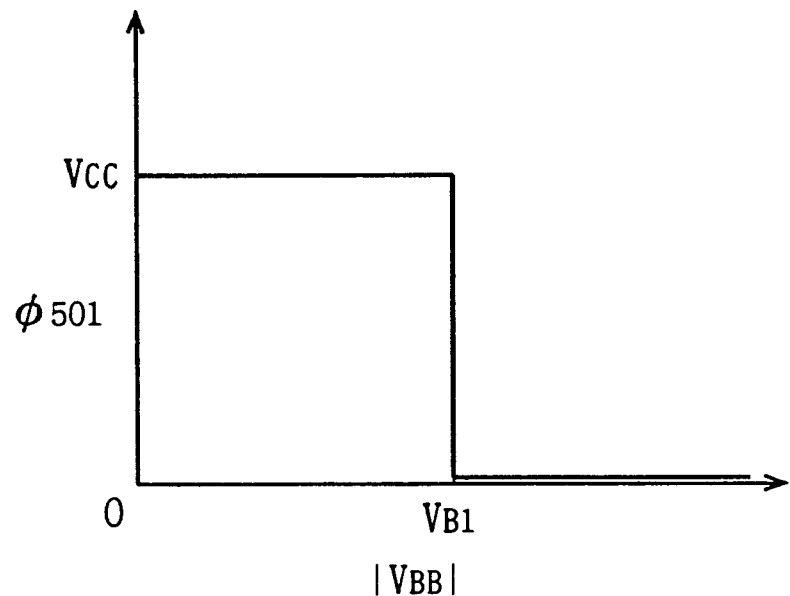
FIGS. 5 and 6 are graphs used in describing the operation of the $V_{BB}$ generation circuit shown in FIG. 4 in the normal operation mode.
Figure 6:
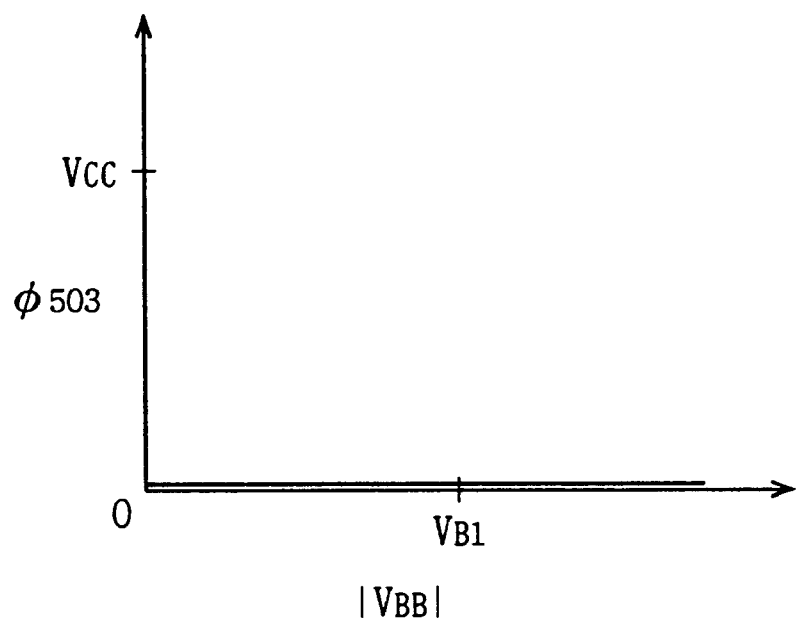
Figure 7:
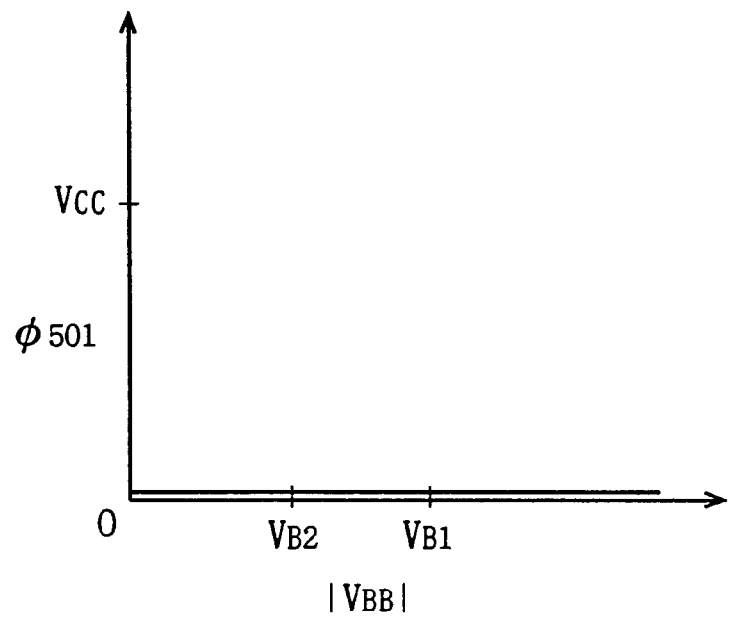
FIGS. 7 and 8 are graphs used in describing the operation of the $V_{BB}$ generation circuit shown in FIG. 4 in the self-refresh mode.
Figure 8:
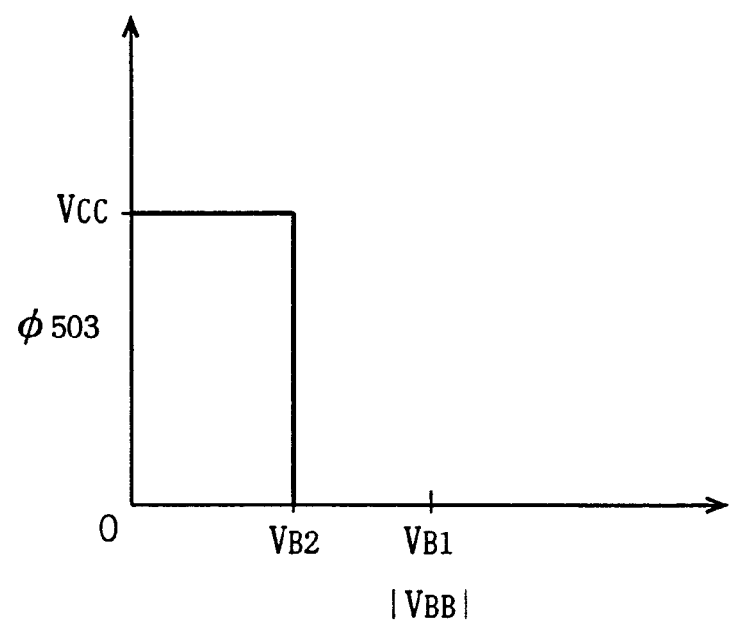

FIGS. 5–8 are diagrams for describing the operation of $V_{BB}$ generation circuit 204 shown in FIG. 4. In particular, FIGS. 5 and 6 illustrate an operation in the normal operation mode, whereas FIGS. 7 and 8 illustrate an operation in the self-refresh mode.

In the normal operation mode, $V_{BB}$ level detection signal $\phi_{503}$ of an L level is always output from $V_{BB}$ level detection circuit 503 regardless of the absolute value of the substrate voltage as shown in FIG. 6, because $V_{BB}$ level detection circuit 503 shown in FIG. 4 is inactivated in response to the inactivation of signal /BBUL to a high (H) level.

When $V_{BB}$ level detection circuit 501 is activated and the absolute value of the substrate voltage is smaller (shallower) than a voltage $V_{B1}$ determined by the threshold of N-channel MOS transistors NT1 and NT2, $V_{BB}$ level detection signal $\phi_{501}$ is activated to an H level, and conversely, $V_{BB}$ level detection signal $\phi_{501}$ is inactivated to an L level when the absolute value of the substrate voltage is larger (deeper) than voltage $V_{B1}$, as shown in FIG. 5. Therefore, in the normal operation mode, $V_{BB1}$ pumping circuit 502 is activated to generate substrate voltage $V_{BB1}$ only when the absolute value of the substrate voltage is smaller than voltage $V_{B1}$.

Meanwhile, in the self-refresh mode, $V_{BB}$ level detection signal $\phi_{501}$ of an L level is always output from $V_{BB}$ level detection circuit 501 regardless of the absolute value of the substrate voltage as shown in FIG. 7, because $V_{BB}$ level detection circuit 501 shown in FIG. 4 is inactivated in response to the activation of signal /BBUL to an L level.

$V_{BB}$ level detection signal $\phi_{503}$ is activated to an H level when $V_{BB}$ level detection circuit 503 is activated and absolute value of the substrate voltage is smaller (shallower) than a voltage $V_{B2}$ ($<V_{B1}$) determined by the threshold of N-channel MOS transistor NT3 as shown in FIG. 8. Conversely, $V_{BB}$ level detection signal $\phi_{503}$ is inactivated to an L level when the absolute value of the substrate voltage is larger (deeper) than voltage $V_{B2}$ as shown in FIG. 8. Thus, in the self-refresh mode, VDC 201 is allowed to supply smaller internal power supply voltage $V_{CC}$ to the internal circuitry by pulling down supplied external power supply voltage Ext.$V_{CC}$. Current Icc consumed in $V_{BB}$ generation circuit 204 can be reduced as well.

Figure 9:
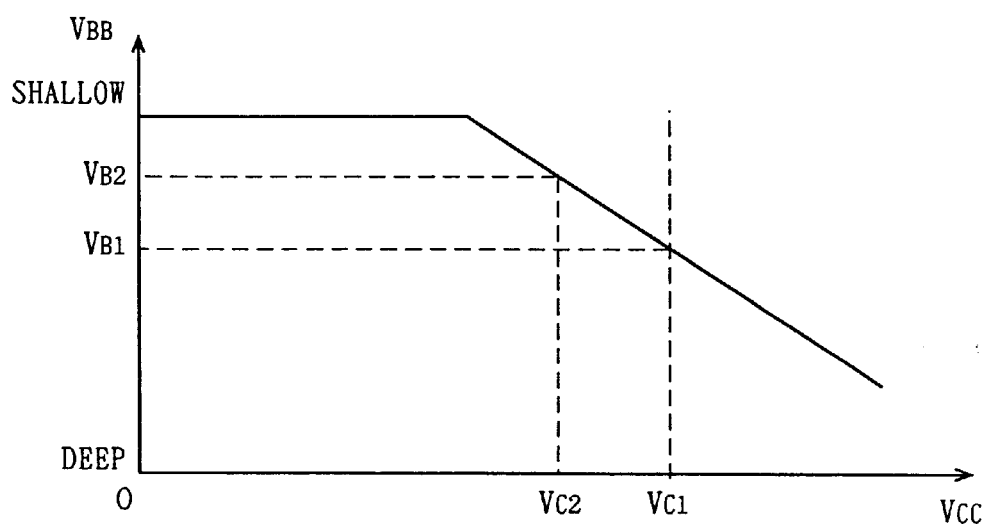
FIG. 9 is a graph showing the relation between the internal power supply voltage and the substrate voltage.
Figure 10:
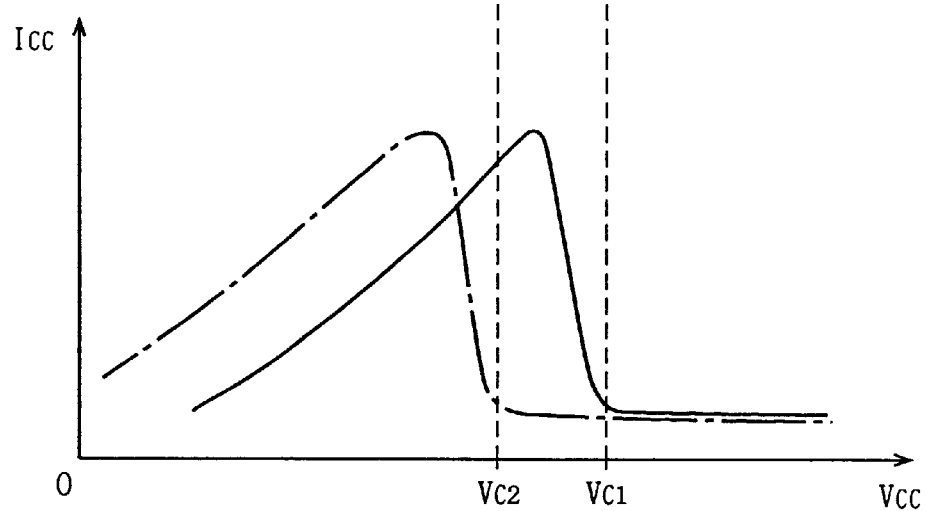
FIG. 10 is a graph showing the relation between the internal power-supply voltage and a current consumed in the $V_{BB}$ generation circuit.

FIGS. 9 and 10 are diagrams showing a performance characteristic of $V_{BB}$ generation circuit 204 when internal power supply voltage $V_{CC}$ is supplied by pulling down the external power supply voltage. FIG. 9 shows the relation of internal power supply voltage $V_{CC}$ and substrate voltage $V_{BB}$ and FIG. 10 shows the relation of internal power supply voltage $V_{CC}$ supplied to $V_{BB}$ generation circuit 204 and current Icc consumed in $V_{BB}$ generation circuit 204.

Referring to FIGS. 9 and 10, when the level of internal power supply voltage $V_{CC}$ is at $V_{C1}$, for example, the level of the substrate voltage is at $V_{B1}$. Current $I_{CC}$ consumed in $V_{BB}$ generation circuit 204 is represented by the solid line in FIG. 10. As shown in FIG. 9, internal power supply voltage $V_{CC}$ can be lowered down to voltage $V_{C2}$ by supplying $V_{B2}$ with an absolute value smaller than the absolute value of voltage $V_{B1}$ as substrate voltage $V_{BB}$. Further, in this case, the power consumption of $V_{BB}$ generation circuit 204 will not increase even if internal power supply voltage $V_{CC}$ is lowered from voltage $V_{C1}$ down to voltage $V_{C2}$, as can be seen from the chain-dotted line in FIG. 10 representing current Icc consumed in $V_{BB}$ generation circuit 204.

Thus, an operation at low voltage with reduced power consumption is allowed in the self-refresh mode by making substrate voltage $V_{BB}$ shallower.

The power consumption can be further reduced by making substrate voltage $V_{BB}$ in the self-refresh mode shallower. In this case, refresh time can be extended (that is, a refresh cycle can be extended) due to the decrease in the pn junction leakage current between storage node and substrate 200.

Figure 11:
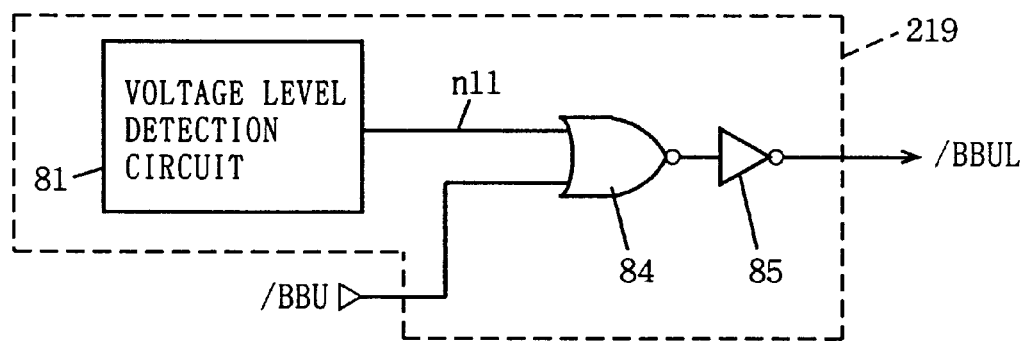
FIG. 11 is a diagram showing the configuration of a /BBUL signal generation circuit shown in FIG. 1.

FIG. 11 shows the configuration of /BBUL signal generation circuit 219 shown in FIG. 1. With reference to FIG. 11, /BBUL signal generation circuit 219 includes a voltage level detection circuit 81, an output node n11 of voltage level detection circuit 81, an NOR circuit 84 receiving a signal output from voltage level detection circuit 81 and self-refresh entry control signal /BBU output from control circuit 202, and an inverter 85 connected to NOR circuit 84.

Figure 12:
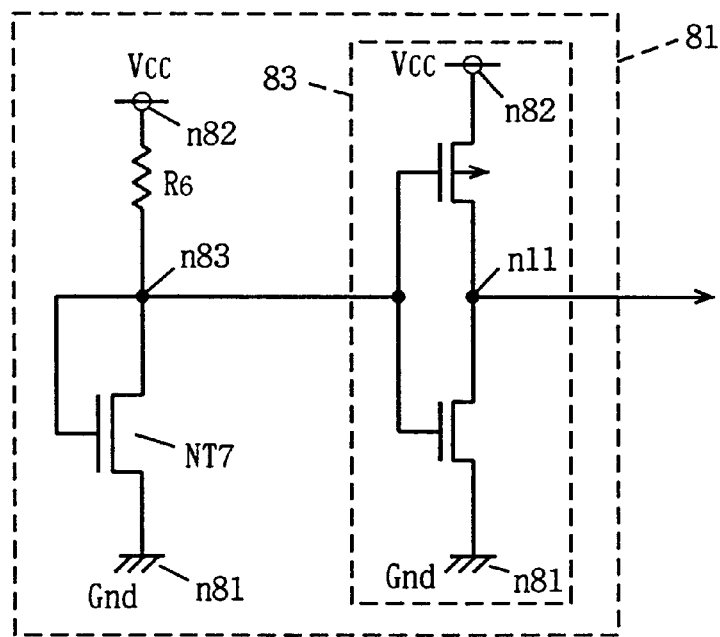
FIG. 12 is a circuit diagram showing the specific configuration of a voltage level detection circuit shown in FIG. 11.

FIG. 12 shows a specific configuration of voltage level detection circuit 81 shown in FIG. 11. Referring to FIG. 12, voltage level detection circuit 81 includes an internal power supply voltage node n82, a node n83, a resistive element R6 connected between internal power supply voltage node n82 and node n83, a ground node n81, an N-channel MOS transistor NT7 connected between node n83 and ground node n81 and having a gate connected to node n83, and an inverter 83 connected to node n83.

Figure 13:
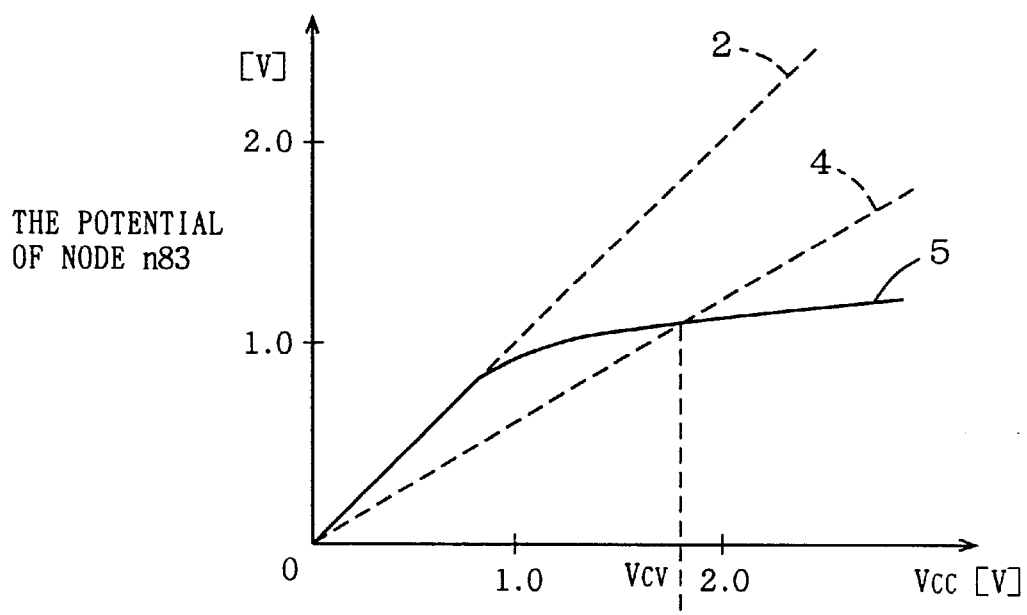
FIG. 13 is a graph showing the relation between the internal power-supply voltage and the potential of a node n83 shown in FIG. 12.

FIG. 13 is a graph showing the relation of internal power supply voltage $V_{CC}$ and the potential of node n83. In FIG. 13, dashed line 2 represents the direct proportionality between internal power supply voltage $V_{CC}$ and the potential of node n83, and, dashed line 4 represents the threshold of inverter 83 for internal power supply voltage $V_{CC}$. As can be seen from curve 5 in FIG. 13, the potential of node n83 is directly proportional to internal power supply voltage $V_{CC}$ as far as internal power supply voltage $V_{CC}$ is equal to or less than about 0.8 V. However, the ratio of increase in the potential of node n83 corresponding to the change of internal power supply voltage $V_{CC}$ decreases, as N-channel MOS transistor NT7 is gradually turned on according to the increase in internal power supply voltage $V_{CC}$.

Figure 14:
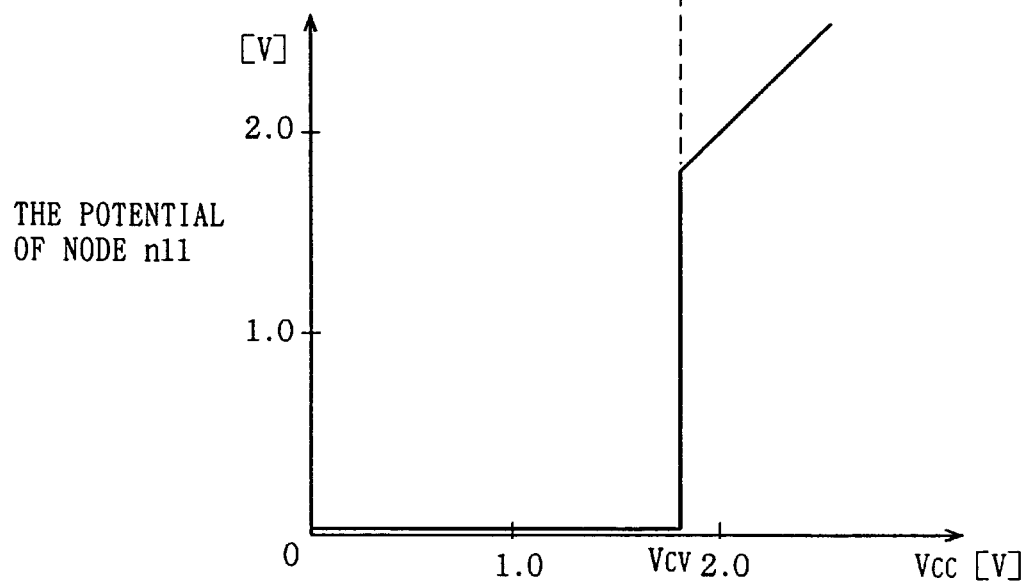
FIG. 14 is a graph showing the relation between the internal power-supply voltage and the potential of a node nll shown in FIG. 12.

FIG. 14 is a graph showing the relation of internal power supply voltage $V_{CC}$ and the potential of node n11. In FIG. 14, voltage $V_{CV}$ represents internal power supply voltage $V_{CC}$ corresponding to the crossing of curve 5 and dashed line 4 in FIG. 13. As shown in FIG. 14 the output voltage of inverter 83, that is, the potential of node n11 is at an L level (0 V) when internal power supply voltage $V_{CC}$ takes a value from 0 V to the value of voltage $V_{CV}$, because the potential of node n83, i.e. the input voltage of inverter 83 is larger than the threshold of inverter 83 denoted by dashed line 4. The potential of node n11 is at a high level (and is directly proportional to internal power supply voltage $V_{CC}$), when internal power supply voltage $V_{CC}$ is larger than voltage $V_{CV}$, because the potential of node n83 is smaller than the threshold of inverter 83 as shown in FIG. 13.

FIGS. 15A–15D are timing charts showing the operation of /BBUL signal generation circuit 219 shown in FIG. 11. As can be seen from FIG. 15B, on entering the self-refresh mode, self-refresh entry control signal /BBU is activated to an L level. When internal power supply voltage $V_{CC}$ becomes lower than or equal to the predetermined voltage as shown in FIG. 15A, the potential of node n11 changes from an H level to an L level as described above and shown in FIG. 15C. Then, signal /BBUL output from inverter 85 is driven from an H level to an L level as shown in FIG. 15D. Conversely when internal power supply voltage $V_{CC}$ becomes higher than or equal to the predetermined voltage, signal /BBUL output from inverter 85 is driven from an L level to an H level as shown in FIG. 15D.

Figure 16:
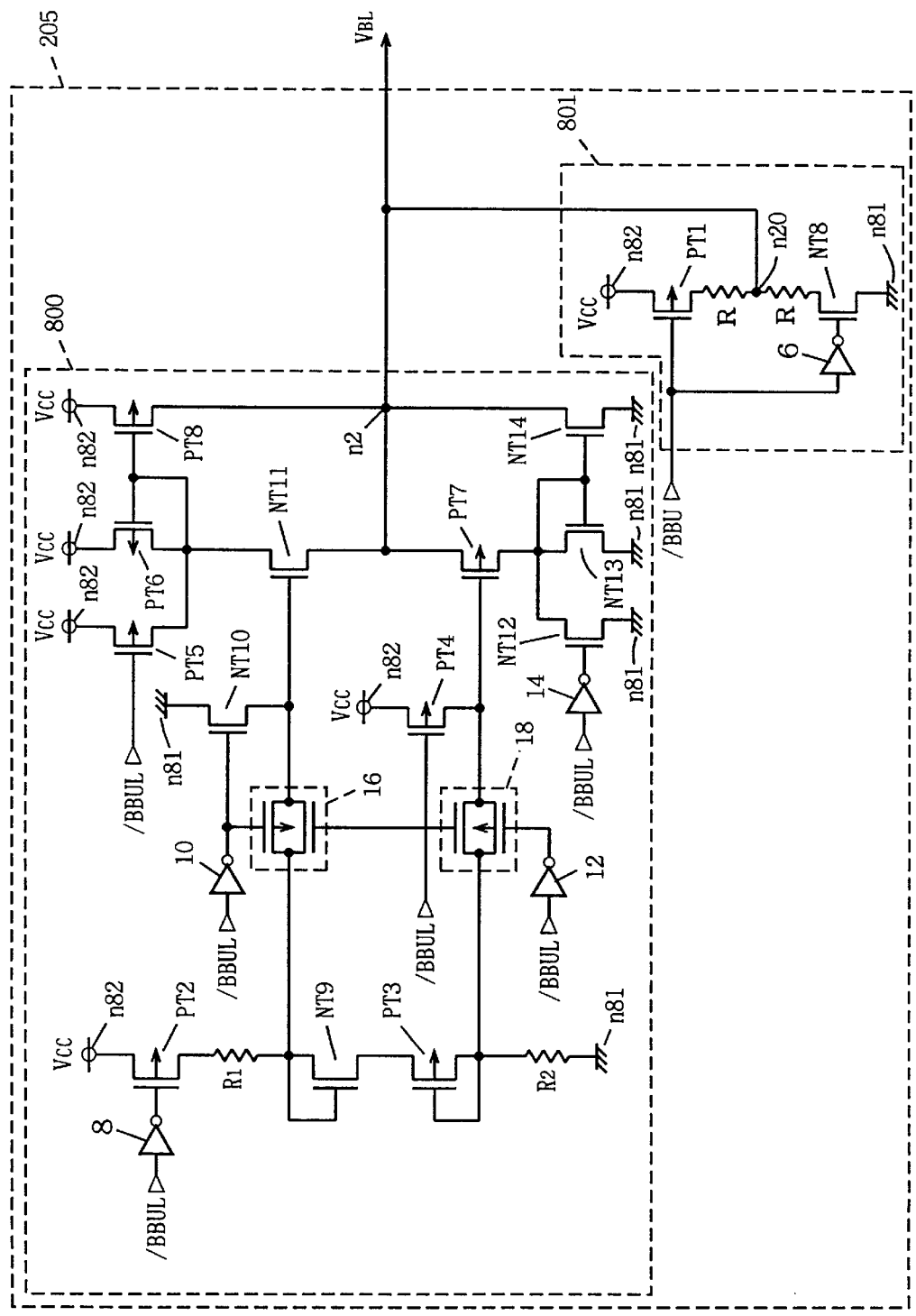
FIG. 16 is a circuit diagram showing the specific configuration of a $V_{BL}$ generation circuit shown in FIG. 1.
Figure 18:
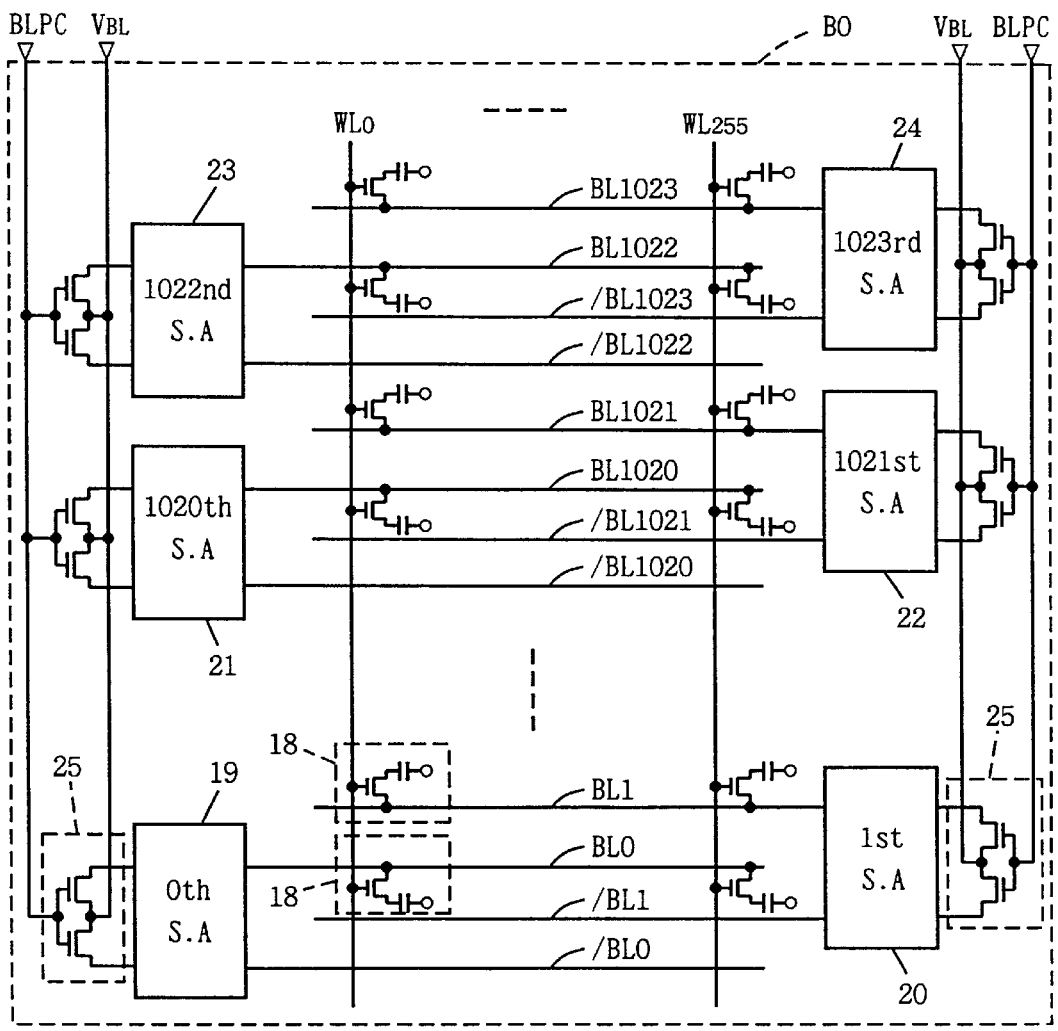
FIG. 18 is a diagram showing a configuration of a block of a memory cell array shown in FIG. 17.

FIG. 16 is a circuit diagram showing the configuration of $V_{BL}$ generation circuit 205 shown in FIG. 1. A bit line equivalent voltage $V_{BL}$ generated in $V_{BL}$ generation circuit 205 is supplied to pairs of bit lines BLn, /BLn when they are precharged, as shown in FIG. 18 (which will be later detailed). Referring to FIG. 16, $V_{BL}$ generation circuit 205 includes a circuit 800 outputting a voltage of about $V_{CC}/2$ as bit line equivalent voltage $V_{BL}$ from node n2 when internal power supply voltage $V_{CC}$ in the self-refresh mode is larger than the predetermined value, i.e., when signal /BBUL is inactivated to an H level, and, a circuit 801 outputting a voltage of about $V_{CC}/2$ produced by resistive-dividing as bit line equivalent voltage $V_{BL}$ from node n20 in the self-refresh mode.

Circuit 801 includes an internal power supply voltage node n82, a P-channel MOS transistor PT1 and a resistive element R connected in series between internal power supply voltage node n82 and node n20, a ground node n81, an N-channel MOS transistor NT8 and a resistive element R connected in series between ground node n81 and node n20 and an inverter 6 connected to the gate of N-channel MOS transistor NT8. Self-refresh entry control signal /BBU is supplied to the gate of P-channel MOS transistor PT1 and inverter 6.

Circuit 800 includes inverters 8, 10, 12, and 14, transfer gates 16 and 18, resistive elements $R_1$ and $R_2$, a node n2, an internal power supply voltage node n82, a ground node n81, N-channel MOS transistors NT9–NT14, and P-channel MOS transistors PT2–PT8.

As $V_{BL}$ generation circuit 205 includes circuit 801 besides circuit 800, stable operation with low power consumption (the generation of bit line equivalent voltage $V_{BL}$) can be achieved. It is because even when internal power supply voltage $V_{CC}$ is made smaller than voltage $(V_{thn}+|V_{thp}|)$ for the reduction of power consumption in the self-refresh mode, the operation would not be unstable. Here, $V_{thn}$ represents the threshold of N-channel MOS transistor NT9, and $V_{thp}$ represents the threshold of P-channel MOS transistor PT3.

Figure 17:
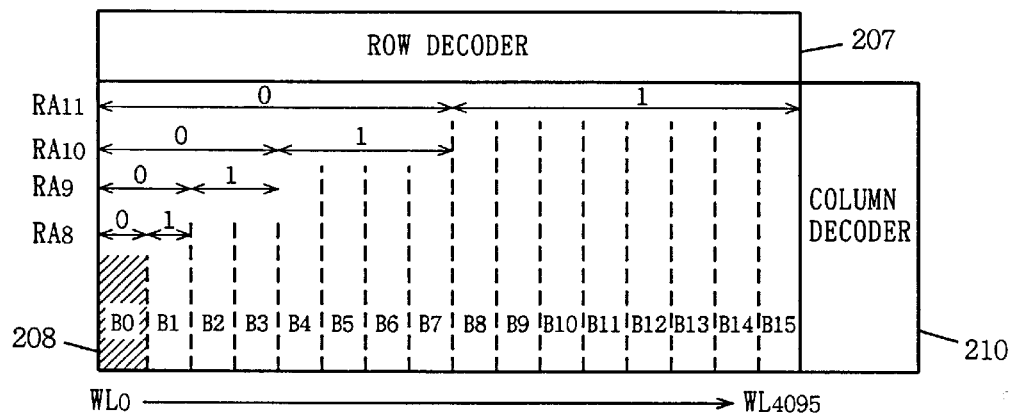
FIG. 17 is a diagram used in describing a 4K refresh operation.

FIG. 17 shows the configuration of row decoder 207, column decoder 210, and memory cell array 208 shown in FIG. 1. Referring to FIG. 17, memory cell array 208 is divided into blocks B0–B15 with 4096 word lines $WL_0$–$WL_{4095}$ arranged therein. Referring to FIG. 19, 2048 word lines $WL_0$–$WL_{2047}$ are arranged in blocks B0–B7, and 2048 word lines $WL_0$–$WL_{2047}$ are arranged in blocks B8–B15.

FIG. 18 is a circuit diagram specifically showing the configuration of block B0 shown in FIGS. 17 and 19. Referring to FIG. 18, block B0 includes 256 word lines $WL_0$–$WL_{255}$, 1024 pairs of bit lines BLn, /BLn (n=0–1023) orthogonal to word lines $WL_0$–$WL_{255}$, a plurality of memory cells 18 connected to word lines $WL_0$–$WL_{255}$ and bit lines BLn (n=0–1023), and, arranged at crossings of word lines $WL_0$–$WL_{255}$ and bit lines BLn (n=0–1023), n (n=0–1023) sense amplifiers (S.A) (6 such sense amplifiers are shown at 19 to 24 by way of illustration) connected respectively to bit lines pairs BLn, /BLn (n=0–1023) and, a bit line precharge circuit 25 connected to bit line pairs BLn, /BLn (n=0–1023). When bit line precharge circuit 25 receives a bit line precharge signal BLPC activated to an H level, bit line equivalent voltage $V_{BL}$ is supplied to bit line pairs BLn, /BLn (n=0–1023), because N-channel MOS transistors included in bit line precharge circuit 25 are turned on.

Next, referring to FIGS. 17 and 19, a 2K refresh operation and a 4K refresh operation in the self-refresh mode will be described. FIG. 19 is used for describing the concept of the 2K refresh operation. Herein RAn (n=8–10) denotes an internal address generated by buffering external address Ext.An (n=8–10) in address circuit 203.

As can be seen from FIG. 19, the 2K refresh operation means simultaneously selecting one of word lines $WL_0$–$WL_{255}$ in each one of two blocks among blocks B0–B15. In FIG. 19, one word line in each of hatched blocks B0 and B8 is selected simultaneously, according to the supplied internal address $(RA_8, RA_9, RA_{10})=(0,0,0)$, for example.

FIG. 17 is used in describing the concept of the 4K refresh operation. As can be seen from FIG. 17, in the 4K refresh operation mode, internal address $RA_{11}$ generated in refresh address generation circuit 221 shown in FIG. 1 is received by address circuit 203 and supplied to row decoder 207. If the internal address supplied to row decoder 207 is, for example, $(RA_8, RA_9, RA_{10}, RA_{11})=(0,0,0,0)$, only one hatched block B0 (i.e. one of word lines $WL_0$–$WL_{255}$ therein) is selected. Therefore, the number of word lines simultaneously selected from word lines $WL_0$–$WL_{4095}$ is less in the 4K refresh operation than in the 2K refresh operation. In the normal operation mode, the same operation as the 2K refresh operation is performed.

FIGS. 20A–20D and FIGS. 21A–21D show power supply voltage and consumed currents in the 2K refresh operation and the 4K refresh operation, respectively.

Figure 20A:
FIGS. 20A–20D are timing charts used in describing the 2K operation.
Figure 20B:
Figure 20C:
Figure 20D:

In the 2K refresh operation mode, two of word lines $WL_0$–$WL_{4095}$ are activated simultaneously as in FIG. 20A, and 1024×2 sense amplifiers (S.A) are activated when data is read out from corresponding memory cells 18 to bit line pairs BLn, /BLn (n=0–1023) as in FIG. 20B. Thus, consumed current Icc increases as shown in FIG. 20C whereas internal power supply voltage $V_{CC}$ decreases as shown in FIG. 20D.

Figure 21A:
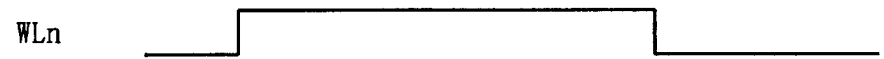
FIGS. 21A–21D are timing charts used in describing the 4K refresh operation.
Figure 21B:
Figure 21C:
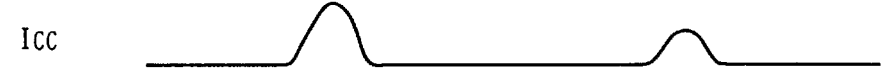
Figure 21D:
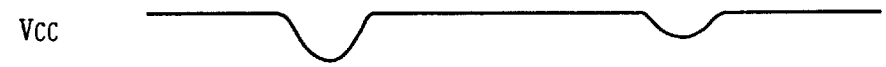

In the 4K refresh operation mode, similarly to the operation in the 2K refresh operation mode, one of word lines $WL_0-WL_{255}$ is activated to read data from corresponding memory cell 18 to bit line pair BLn, /BLn as shown in FIGS. 21A–21D. Consumed current Icc and internal power supply voltage $V_{CC}$ change as shown in FIGS. 21C and 21D. Unlike the 2K refresh operation where two word lines of word lines $WL_0-WL_{255}$ are selected simultaneously, in the 4K refresh operation only one of word lines $WL_0-WL_{255}$ is selected simultaneously. Therefore only 1024 sense amplifiers (S.A)

The 2K operation (including the read/write operation in the normal operation mode and the 2K refresh operation in the self-refresh mode) and the 4K operation (corresponding to the 4K refresh operation in the self-refresh mode) in row decoder 207 will be described referring to Table 1 below.

TABLE 1

| mode | Ext. A8 | Ext. A9 | Ext. A10 | 4KE | /RA8 | RA8 | /RA9 | RA9 | /RA10 | RA10 | /RA11 | RA11 | RBS0 | ... | RBS8 | ... | RBS15 |
|---|---|---|---|---|---|---|---|---|---|---|---|---|---|---|---|---|---|
| 2K operation | L | L | L | L | H | L | H | L | H | L | | | H | ... | H | ... | L |
| 4K operation | L | L | L | H | H | L | H | L | H | L | H | L | H | ... | L | ... | L | shown in FIG. 18 are activated. Thus, current Icc in FIG. 21C is smaller than current Icc in FIG. 20C, and, internal power supply voltage $V_{CC}$ decreases less in FIG. 21D than in FIG. 20D.

Generally, a semiconductor memory device having the overall form of this first embodiment would perform the 2K refresh operation in the self-refresh mode because only external addresses Ext.A0–Ext.A10 are supplied from outside as shown in FIG. 1. The semiconductor memory device according to the first embodiment of the invention, however, further includes refresh address generation circuit 221 and performs the 4K refresh operation in the self-refresh mode for further reduction in power consumption.

Refresh address generation circuit 221 receives self-refresh entry control signal /BBU acting as a trigger for generating internal address $RA_{11}$ as a refresh address and, reference signal $\phi_{REF}$ for incrementing (decrementing) a refresh address from control circuit 202.

Figure 22:
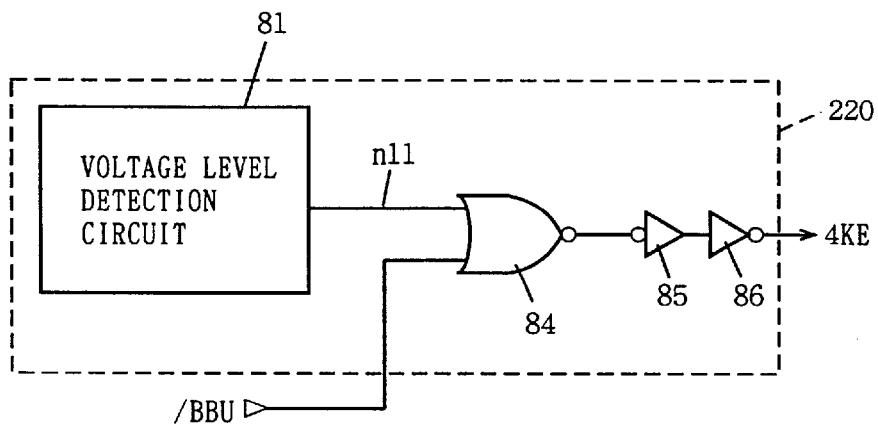
FIG. 22 is a diagram showing the configuration of a 4KE signal generation circuit shown in FIG. 1.

FIG. 22 shows the configuration of 4KE signal generation circuit 220 shown in FIG. 1.

Referring to FIG. 22, 4KE signal generation circuit 220 includes a voltage level detection circuit 81, a node n11, an NOR circuit 84 receiving a signal output from voltage level detection circuit 81 and self refresh entry control signal /BBU, an inverter 85 connected to NOR circuit 84, and an inverter 86 connected to inverter 85. The configuration of voltage level detection circuit 81 is specifically shown in FIG. 12.

Figure 23A:
FIGS. 23A–23D are timing charts used in describing the operation of the 4KE signal generation circuit shown in FIG. 22.
Figure 23B:
Figure 23C:
Figure 23D:

FIGS. 23A–23D are used in describing the operation of 4KE signal generation circuit 220. As entering the self-refresh mode, self-refresh entry control signal /BBU is activated to an L level as shown in FIG. 23B. Then, internal power supply voltage $V_{CC}$ becomes equal to or lower than the predetermined value as shown in FIG. 23A, causing a signal of an L level to be output from the voltage level detection circuit as shown in FIG. 23C. Then, signal 4KE of an H level is output as shown in FIG. 23D.

Figure 24:
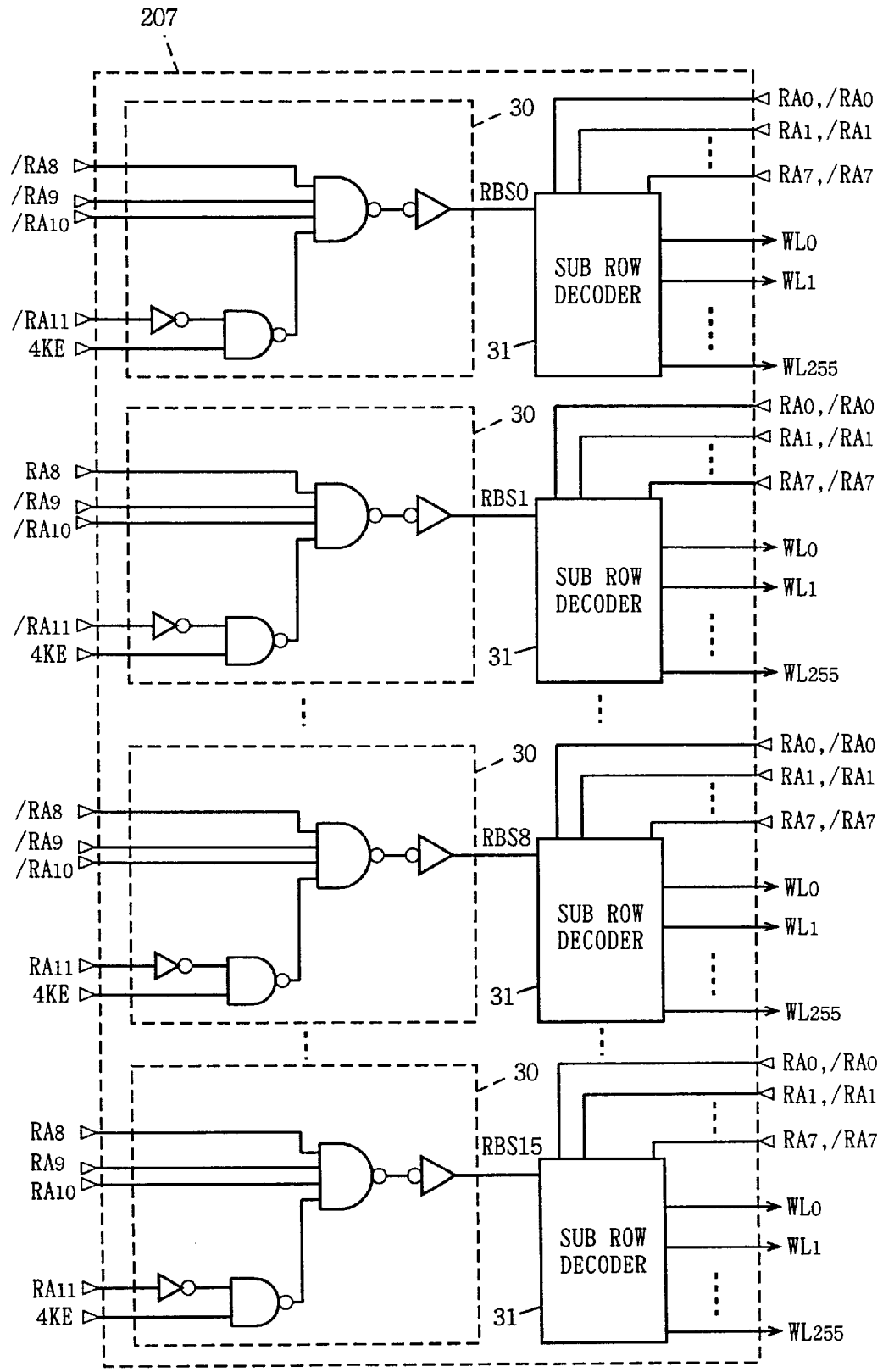
FIG. 24 is a diagram showing the specific configuration of a row decoder shown in FIG. 1.

FIG. 24 shows the specific configuration of row decoder 207 shown in FIG. 1. Referring to FIG. 24, row decoder 207 includes 16 RBSn signal generation circuits 30 and sub row decoders 31 connected respectively to RBSn signal generation circuits 30. Each sub row decoder 31 includes 256 NAND circuits corresponding to word lines $WL_0-WL_{255}$ and receiving a 9-bit signal which consists of a 1-bit signal RBSn (n=0–15) and a 8-bit internal address RAn (n=0–7).

With reference to Table 1, the 2K operation is performed when signal 4KE is inactivated to an L level. If an externally applied address (Ext.A8, Ext.A9, Ext.A10)=(L,L,L), for example, is input, only signals RBS0 and RBS8 attain an H level. Then each of sub row decoders 31 corresponding to the signals selects one word line of word lines $WL_0-WL_{255}$ according to internal address RAn (n=0–7) input to sub row decoder 31.

Meanwhile, in the self-refresh mode, when internal power supply voltage $V_{CC}$ falls below the predetermined value, signal 4KE activated to an H level is supplied to row decoder 207 from 4KE signal generation circuit 220 for the 4K operation. In this case, as shown in Table 1, when an externally applied address (Ext. A8, Ext. A9, Ext. A10)=(L, L,L), for example, is input and an internal address $RA_{11}$(=L) is supplied from refresh address generation circuit 221 through address circuit 203, only signal RBS0 is activated to an H level. Then, only one corresponding sub row decoder 31 selects one of word lines $WL_0-WL_{255}$ according to input internal address RAn (n=0–7).

Further reduction in power consumption in the data holding state is allowed by performing the above described 4KE operation in the self-refresh mode.

Second Embodiment

A semiconductor memory device according to a second embodiment of the invention has the same configuration as the device according to the first embodiment except that $V_{BB}$ generation circuit 204 shown in FIG. 1 is replaced with a circuit shown in FIG. 25.

Referring to FIG. 25, $V_{BB}$ generation circuit 204 included in the semiconductor memory device of the second embodiment includes an internal power supply voltage level detection circuit 701, a first $V_{BB}$ level detection circuit 702 connected to internal power supply voltage level detection circuit 701, a second $V_{BB}$ level detection circuit 704 connected to internal power supply voltage level detection circuit 701, a first $V_{BB}$ pumping circuit 703 connected to first $V_{BB}$ level detection circuit 702, and a second $V_{BB}$ pumping circuit 703 connected to second $v_{BB}$ level detection circuit 704.

Internal power supply voltage level detection circuit 701 includes an internal power supply voltage node n82, a node n70, a resistive element R5 connected between node n70 and internal power supply voltage node n82, a ground node n81, N-channel MOS transistors NT4–NT6 connected in series between node n70 and ground node n81 with the gate and the drain of each being connected, and an inverter 40 connected to node n70.

First $V_{BB}$ level detection circuit 702 includes inverters 41–43, an internal power supply voltage node n82, a ground node n81, N-channel MOS transistors NT20 and NT21, and a P-channel MOS transistor PT20.

Second $V_{BB}$ level detection circuit 704 includes inverters 44 and 45, an internal power supply voltage node n82, a ground node n81, an N-channel MOS transistor NT22, and a P-channel MOS transistor PT21.

Each of first and second $V_{BB}$ pumping circuit 703 includes, a ground node n81, an NAND circuit 46, inverters 47–50, a capacitor 51, and, P-channel MOS transistors PT22 and PT23.

Next, the operation of $V_{BB}$ generation circuit 204 according to the second embodiment will be described. When internal power supply voltage $V_{CC}$ is low, the output of internal power supply voltage level detection circuit 701, that is, the output of inverter 40, is at an L level. Then P-channel MOS transistor PT21 is turned on, causing the activation of second $V_{BB}$ level detection circuit 704. Conversely, when internal power supply voltage $V_{CC}$ is high, the output of internal power supply voltage level detection circuit 701 i.e. the output of inverter 40, attains an H level, because N-channel MOS transistors NT4–NT6 are gradually turned on in sequence. In this case, first $V_{BB}$ level detection circuit 702 is activated as P-channel MOS transistor PT20 is turned on.

Thus, stable operation of $V_{BB}$ generation circuit 204 in a wider voltage range is possible by setting the level of substrate voltage ($V_{BB}$) shallow when internal power supply voltage $V_{CC}$ is low, and by setting the level of $V_{BB}$ deep when internal power supply voltage $V_{CC}$ is high.

$V_{BB}$ generation circuit 204 according to the second embodiment differs from $V_{BB}$ generation circuit 204 of the first embodiment in that the latter changes the level of $V_{BB}$ in accordance with the mode, whereas, the former changes the level of $V_{BB}$ in accordance with the magnitude of internal power supply voltage $V_{CC}$ regardless of the mode.

Thus, $V_{BB}$ generation circuit 204 of the second embodiment makes the level of $V_{BB}$ shallow only when internal power supply voltage $V_{CC}$ falls down below the predetermined value and not when the mode is switched. Accordingly, $V_{BB}$ generation circuit 204 of the second embodiment enjoys the advantage that a malfunction of $V_{BB}$ generation circuit 204 due to an accidental change-over to the self-refresh mode caused by noise, for example, can be prevented.

Third Embodiment

Figure 26:
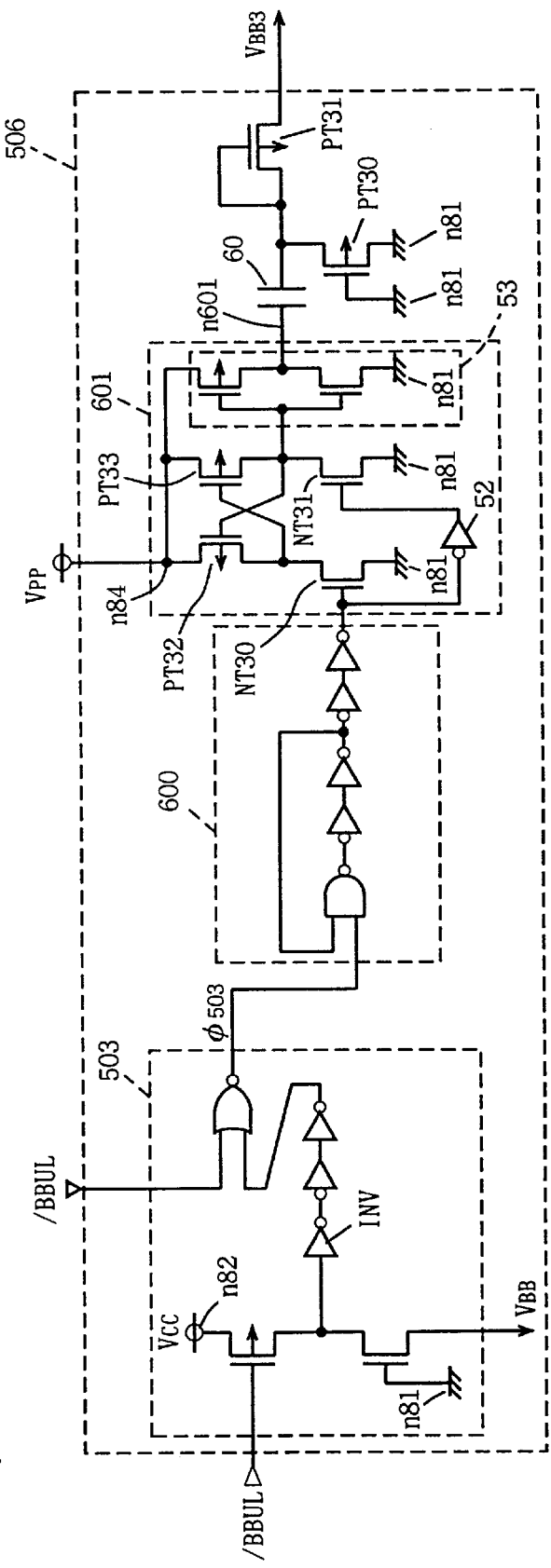
FIG. 26 is a circuit diagram showing the configuration of the $V_{BB3}$ generation circuit included in the $V_{BB}$ generation circuit provided in a semiconductor memory device according to a third embodiment of the invention.

A semiconductor memory device according to the third embodiment has the same configuration as the semiconductor memory device according to the first embodiment except that $V_{BB2}$ generation circuit 505 shown in FIG. 4 and included in $V_{BB}$ generation circuit 204 shown in FIG. 1 is replaced with $V_{BB3}$ generation circuit 506 shown in FIG. 26.

Referring to FIG. 26, $V_{BB3}$ generation circuit 506 includes a $V_{BB}$ level detection circuit 503, an oscillation circuit 600 oscillating by receiving $V_{BB}$ level detection signal $\phi_{503}$ output from $V_{BB}$ level detection circuit 503, a level converter 601 connected to oscillation circuit 600 and converting the amplitude of an input signal from internal power supply voltage $V_{CC}$ to boosted voltage $V_{PP}$, an output node n601 of level converter 601, a capacitor 60 connected to level converter 601, and P-channel MOS transistors PT30 and PT31.

Level converter 601 includes, a node n84 to which boosted voltage $V_{PP}$ is supplied, a ground node n81, inverters 52 and 53, N-channel MOS transistors NT30 and NT31, and P-channel MOS transistors PT32 and PT33.

In $V_{BB3}$ generation circuit 506, theoretically the absolute value of substrate voltage $V_{BB3}$ is voltage ($V_{PP}-2|V_{thpt}|$), as the amplitude of output node n601 corresponds to boosted voltage $V_{PP}$. Here, $V_{thpt}$ represents the threshold voltage of P-channel MOS transistors PT30 and PT31.

According to the semiconductor memory device of the third embodiment, the level of the substrate voltage at a low internal power supply voltage $V_{CC}$ can be made sufficiently deep by using boosted voltage $V_{PP}$ for $V_{BB3}$ generation circuit 506 included in $V_{BB}$ generation circuit 204. Therefore, substrate voltage $V_{BB}$ optimal for the self-refresh mode at low power can be generated with a sufficient margin.

In addition a device, in which voltage down converter 201 is not incorporated, may operate in a same manner, because in the semiconductor memory device according to the first to third embodiments described above, internal power supply voltage $V_{CC}$ can be adjusted by an external controller.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:

a substrate;

a memory cell array formed on said substrate and including a plurality of memory cells for storing data;

memory cell selection means formed on said substrate for selecting at least one of said plurality of memory cells to/from which said data is written/read out; and substrate voltage generation means formed on said substrate for generating and supplying to said substrate a first substrate voltage when an internal power supply voltage is larger than a predetermined value, and a second substrate voltage with an absolute value smaller than the absolute value of said first substrate voltage when said internal power supply voltage is smaller than said predetermined value.

2. The semiconductor memory device according to claim 1, wherein said substrate voltage generation means includes:

comparing means for comparing said internal power supply voltage with said predetermined value, first substrate voltage generation means for generating said first substrate voltage, and activated when said comparing means determines that said internal power supply voltage is larger than said predetermined value, and second substrate voltage generation means for generating said second substrate voltage, and activated when said comparing means determines that said internal power supply voltage is smaller than said predetermined value.

3. The semiconductor memory device according to claim 2, wherein said comparing means includes:

an internal power supply voltage node, a comparison result output node, a resistor connected between said internal power supply voltage node and said comparison result output node, a ground node, and at least one N-channel MOS transistor connected between said comparison result output node and said ground node and having a gate and a drain connected to each other.

4. The semiconductor memory device according to claim 1, having a normal operation mode and a self-refresh mode, further comprising:

mode switching means formed on said substrate for switching between said normal operation mode and said self-refresh mode according to an external control signal; and internal power supply voltage generating means for generating said internal power supply voltage smaller than said internal power supply voltage in said normal operation mode when said mode switching means switches the mode to said self-refresh mode.

5. A semiconductor memory device having a normal operation mode and a self-refresh mode, comprising:

a plurality of word lines;

a plurality of bit line pairs orthogonal to said plurality of word lines;

a plurality of memory cells arranged corresponding to crossings of said plurality of word lines and said plurality of bit line pairs;

bit line precharge means for supplying a bit line equivalent voltage to each of said plurality of bit line pairs;

bit line equivalent voltage generation means for generating said bit line equivalent voltage, said bit line equivalent voltage generation means including resistive dividing means for dividing an internal power supply voltage by resistance to generate said bit line equivalent voltage in said self-refresh mode; and mode switching means for switching between said normal operation mode and said self-refresh mode according to an external control signal.

6. The semiconductor memory device according to claim 5, wherein said resistive dividing means includes:

an internal power supply voltage node, an output node for outputting said bit line equivalent voltage, a first conductivity type transistor connected between said internal power supply voltage node and said output node and turned on in said self-refresh mode;

a first resistance connected between said first conductivity type transistor and said output node, a ground node, a second conductivity type transistor connected between said ground node and said output node and turned on in said self-refresh mode, and a second resistance connected between said second conductivity type transistor and said output node.

7. A semiconductor memory device having a normal operation mode and a self-refresh mode, comprising:

a plurality of word lines;

a plurality of memory cells connected to said plurality of word lines;

a plurality of bit lines connected to said plurality of memory cells;

mode switching means for switching between said normal operation mode and said self-refresh mode according to an external control signal; and word line selecting means for simultaneously selecting and activating a smaller number of said word lines than that simultaneously selected and activated in said normal operation mode, when said mode switching means switches the mode to said self-refresh mode.

8. The semiconductor memory device according to claim 7, further comprising:

voltage down converting means for down-converting an externally applied power supply voltage into a lower voltage than that in said normal operation mode to generate an internal power supply voltage when said mode switching means switches the mode to said self-refresh mode.

9. In a semiconductor memory device of a type having selectively a normal operation mode and a self operation mode, and comprising a plurality of word lines, a plurality of bit lines and a plurality of memory cell interconnected with said word lines and bit lines, an operating method comprising:
in said normal operation mode, selecting and operating a first number of word lines, and in said self-refresh mode, selecting and activating a second number of word lines less than the first number of word lines.

10. The method according to claim 9, including:

in the self-refresh mode, down-converting an externally applied power supply voltage into a voltage lower than that in the normal operation mode to generate an internal power supply voltage.

* * * * *

UNITED STATES PATENT AND TRADEMARK OFFICE
CERTIFICATE OF CORRECTION

PATENT NO. : 6,026,043
DATED : February 15, 2000
INVENTOR(S) : Tomio Suzuki

It is certified that error appears in the above-indentified patent and that said Letters Patent is hereby corrected as shown below:

Delete Claims 1-6.

Signed and Sealed this

Twentieth Day of March, 2001

Attest:

NICHOLAS P. GODICI

*Attesting Officer*   *Acting Director of the United States Patent and Trademark Office*